United States Patent [19]

Hitotsumachi

[11] Patent Number: 4,648,118
[45] Date of Patent: Mar. 3, 1987

[54] APPARATUS FOR REDUCING NOISE IN AUDIO SIGNALS

[75] Inventor: Shuzo Hitotsumachi, Yawata, Japan

[73] Assignee: Matsushita Electric Industrial Co., Ltd., Osaka, Japan

[21] Appl. No.: 721,646

[22] Filed: Apr. 10, 1985

[30] Foreign Application Priority Data

Apr. 20, 1984 [JP] Japan .................................. 59-80422
Sep. 7, 1984 [JP] Japan ................................. 59-188365

[51] Int. Cl.$^4$ ............................................. H04B 1/12
[52] U.S. Cl. ..................................... 381/94; 360/19.1
[58] Field of Search .................. 381/94, 97; 455/304, 455/303; 360/19.1, 64

[56] References Cited

U.S. PATENT DOCUMENTS

| | | | |
|---|---|---|---|
| 3,374,435 | 3/1968 | Engel | 455/304 |
| 4,198,541 | 4/1980 | Fukushima | 381/94 |
| 4,305,042 | 12/1981 | Tanaka | 455/304 |
| 4,311,963 | 1/1982 | Watanabe | 455/304 |
| 4,314,377 | 2/1982 | Kondo | 455/304 |
| 4,329,714 | 5/1982 | Pritchard | 381/94 |
| 4,490,754 | 12/1984 | Kluth | 360/19.1 |
| 4,495,643 | 1/1985 | Orban | 381/94 |
| 4,509,083 | 4/1985 | Nakano | 360/19.1 |
| 4,539,602 | 9/1985 | Okano | 360/19.1 |
| 4,559,567 | 12/1985 | Maruichi | 360/19.1 |

Primary Examiner—Gene Z. Rubinson
Assistant Examiner—L. C. Schroeder
Attorney, Agent, or Firm—Stevens, Davis, Miller & Mosher

[57] ABSTRACT

In a rotary head magnetic recording and reproducing system of a helical-scan type for successively recording and reproducing audio signals in and from record patterns on a magnetic tape, which record patterns are inclined relative to the longitudinal direction of the magnetic tape, by a magnetic head provided on a rotary cylinder, during the successive reproduction of the record patterns by the magnetic head, in order to prevent noise from being contained in a reproduced audio signal, which noise is caused by the switching of the record patterns to be reproduced or by the occurrence of a dropout in the reproduced signal, an audio signal is divided into two discrete signals which have a phase difference therebetween and are transmitted respectively on two separate transmission paths, and two hold circuits, each of which is arranged in one of the two transmission paths, are put into operation in synchronism with the switching of the record patterns or the occurrence of the dropout in the reproduced signal, and output signals of the two hold circuits are added together thereby to reduce noise contained in the reproduced output audio signal.

2 Claims, 6 Drawing Figures

APPARATUS FOR REDUCING NOISE IN AUDIO SIGNALS

The present invention relates to an apparatus for reducing noise in audio signals for use in a rotary head magnetic recording and reproducing system of a helical-scan type in which a magnetic tape, which is wrapped helically on the surface of a rotary cylinder at a given angle with the axis of rotation of the rotary cylinder, is fed along a path of rotation for at least one magnetic head provided on the rotary cylinder so that the magnetic head successively records and reproduces audio signals in and from a group of record patterns in the magnetic tape inclined relative to the longitudinal direction of the magnetic tape.

In the recording and reproduction of audio signals in the helical-scan type magnetic recording and reproducing system, as audio signals are reproduced successively from the group of record patterns inclined relative to the longitudinal direction of the magnetic tape, noise occurs in the reproduced audio signals at the time when the reproduction of audio signals is switched from one pattern to an adjacent pattern in the magnetic tape. Noise is produced also when a dropout is contained in a record pattern from which audio signals are reproduced by the magnetic head. This is because of the use of a frequency modulation wave in the recording of audio signals. As a measure for reducing such noise, it has been a usual practice that, when the switching between the record patterns is effected or when dropout noise occurs in the reproduced signals, the demodulated audio signal voltage is held over the time period when the noise is present. Thus, there has been a disadvantage such that, while the reduction of spike noise is attained, the waveform of the reproduced signal at the signal voltage holding portion differs from that of the original audio signal.

It is therefore an object of the present invention to provide an improved apparatus for reducing noise in audio signals which overcomes the foregoing deficiencies in the prior art.

In accordance with this invention, an audio signal modulated wave reproduced by a magnetic head, which is provided on a rotary cylinder, is demodulated to pass through a phase shifter for shifting the phase of the demodulated audio signal, thereby generating two signals which are different in the phase. There is provided in the path for each of the two signals a hold circuit which operates in synchronism with the successive switching between the record patterns in a magnetic tape to be reproduced and also operates in response to the occurrence of dropout noise in the reproduced signal of the modulated wave, and a sum output signal of output signals from the two hold circuits is obtained to thereby attain the reduction of noise.

The invention may be better understood by referring to the following detailed description and to the accompanying drawings.

Figure 1:
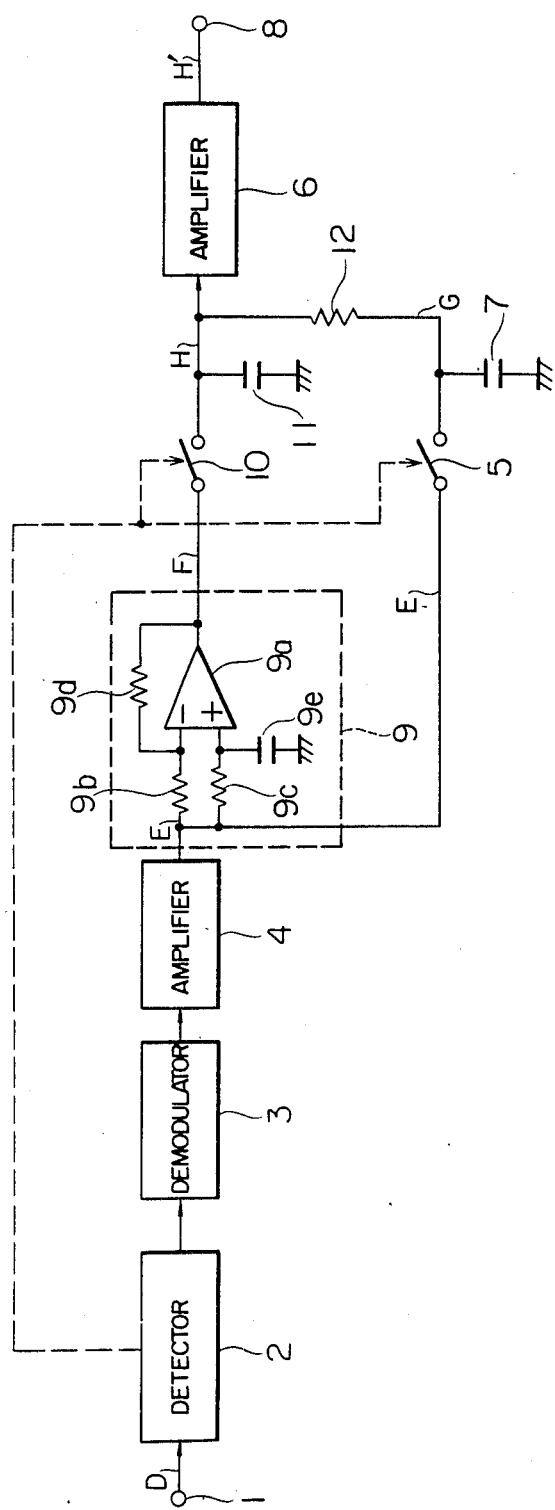
FIG. 1 is a block diagram showing an apparatus according to an embodiment of this invention.

An embodiment of this invention will now be described with reference to FIG. 1. Numeral 1 designates an input terminal to which a reproduced signal of the modulated wave is applied, 2 a detector for detecting the magnitude of the reproduced modulated wave signal applied to the input terminal 1, 3 a demodulator, 4 and 6 amplifiers, 5 and 10 switches which are switched off in response to the operation of the detector 2, 7 and 11 holding capacitors, 8 an output terminal, and 9 an all-pass circuit which is connected to an output of the amplifier 4 to operate as a phase shifter and includes an operational amplifier 9a, resistors 9b and 9c connected respectively to inverting and non-inverting input terminals to the operational amplifier 9a, a resistor 9d connected across an output terminal and the inverting input terminal of the operational amplifier 9a and a capacitor 9e connected across the non-inverting input terminal and the ground. The switch 10 is responsive to the operation of the detector 2 and applies an output signal F of the all-pass circuit 9 to an input terminal to the amplifier 6. The capacitor 11 has an end thereof connected to the input terminal of the amplifier 6 and the other end thereof connected to the ground. Numeral 12 designates a resistor connected between the output terminal of the switch 5 and the input terminal to the amplifier 6. The resistor 12 acts as an adder for adding up the voltages across the holding capacitors 7 and 11. Note that a combination of the switch 5 and the capacitor 7 and that of the switch 10 and the capacitor 11 form respective holding circuits.

Figure 2A:
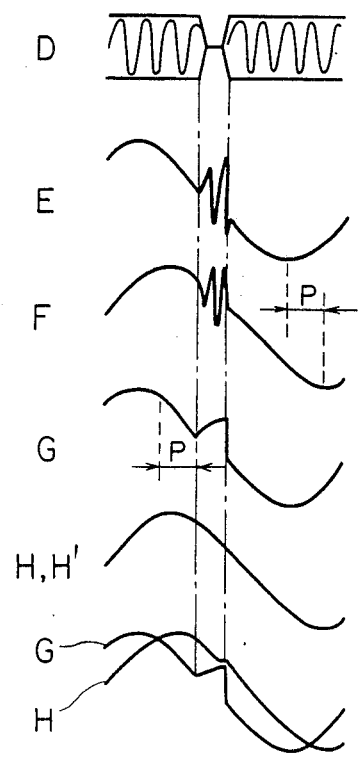
FIGS. 2A and 2B are waveform diagrams showing a plurality of waveforms generated at various portions of the apparatus shown in FIG. 1 which are useful for explaining the operation of the apparatus.

FIG. 2A shows a plurality of waveforms appearing at various portions of the apparatus shown in FIG. 1. With the construction described above, the operation of this embodiment will be described hereunder.

Firstly, a modulated wave D reproduced from a recording medium such as a video tape is applied to the input terminal 1 and then to the detector 2 for detecting the magnitude of the input signal. The output signal of the detector 2 is applied to the demodulator 3 thereby to be demodulated and converted into a signal such as an audio signal or a musical signal. Then, the demodulated signal is amplified through the amplifier 4 to produce a signal E. Then, the phase of the high frequency component of the signal E in the audio frequency band is delayed by a time P through the all-pass circuit 9, thereby generating a signal F. The signal F passes through the switch 10, when it is closed, and forms a signal H, which signal H is applied to the amplifier 6 thereby to be amplified. Then, a signal H' capable of driving a power amplifier and actuating a loudspeaker is generated at the output terminal 8 of the amplifier 6. As mentioned above, an end of the holding capacitor 11 is connected to the input terminal to the amplifier 6, and at the same time the output signal E from the amplifier 4 is applied to the same input terminal through the switch 5, when it is closed, and through the resistor 12. Here, since the all-pass circuit 9 is constructed to have a preselected low output impedance, the output signal E does not have influence on the frequency characteristics of the total signal pass circuit 9 in the audio frequency band.

Usually, under normal operating conditions, it is possible to reproduce and hear the audio signals recorded on the recording medium by the use of this apparatus. However, if a dropout waveform appears in the reproduced modulated wave D due to the presence of defects or the like in the recording medium, the demodulator 3 produces dropout noise caused by the dropout portion of the recording medium. The operation of the apparatus in such a case will now be described in detail.

Figure 2B:
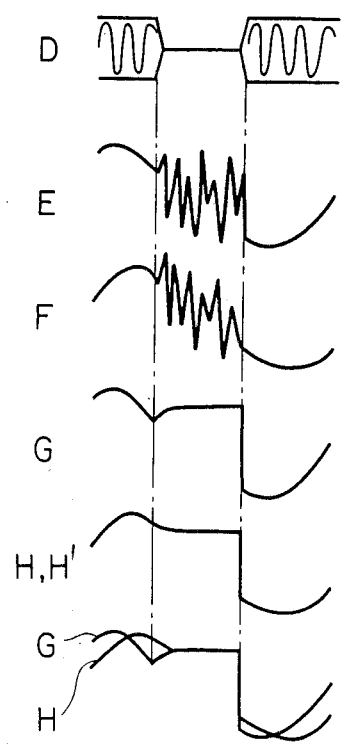

When a dropout failure occurs in the reproduced modulated wave D applied to the input terminal 1 and thereby the level of the reproduced modulated wave decreases, the detector 2 detects it and starts its operation and switches off the switches 5 and 10, whereby the dropout noise produced by the demodulator 3 is prevented from being transmitted to the output terminal 8. At the time when the switches 5 and 10 are opened, the capacitor 7 connected to the output terminal of the switch 5 functions to hold the output voltage of the amplifier 4 immediately before the occurrence of the dropout noise and the capacitor 11 functions to hold the output voltage of the all-pass circuit 9 immediately before the occurrence of the dropout noise. Since the output voltage F of the all-pass circuit 9 is delayed by the time P from the input signal thereto, namely, the output signal E of the amplifier 4, the voltage held in the capacitor 7 is equal to the voltage value generated from the all-pass circuit 9 after the time P. Then, since the resistor 12 is connected between the capacitors 7 and 11, the difference between the voltages held in the capacitors 7 and 11, respectively, decreases gradually. In other words, the voltage of the input end to the amplifier 6, to which the capacitor 11 is connected, varies, after the turning off of the switch 10, toward the voltage value which is to be reached by the output voltage of the all-pass circuit 9 after the delay time P. The performance waveforms of the apparatus in FIG. 1 is shown in FIG. 2A. In FIG. 2A, symbols D to H' indicate the signals D to H' appearing at various portions of the apparatus shown in FIG. 1. As shown in FIG. 2A, the shorter the duration of the dropout waveform is, the closer is the reformed output signal to the original signal, which shows a greater noise reducing effect than that obtained by the prior art apparatus. On the other hand, if the duration of the dropout waveform is long as shown in FIG. 2B, the capacitors 7 and 11 hold respective constant terminal voltages which have become equal to each other, thereby effecting noise reduction. In FIG. 2B, the designation of the symbols D to H' is identical with that of the symbols used in FIG. 2A. Here, the waveform of the dropout noise contains a greater number of higher frequency components than the demodulated signal, so that even after passing through the all-pass circuit 9, the dropout noise waveform has only a small amount of time delay as shown in FIG. 2A.

The foregoing explanation has been made of the operation of the apparatus of this invention to be performed when dropout noise has occurred in a modulated wave reproduced from a magnetic tape. However, it is also possible to similarly reduce noise occurring in a demodulated output signal due to the discontinuity in a modulated wave reproduced successively from the discrete discontinuous record tracks on a video tape. The problem in this case may be solved by switching off the switches 5 and 10 in response to a track switching signal and maintaining the switches 5 and 10 opened over the time period, ten microseconds for example, during which the demodulator 3 produces noise due to the switching of record tracks on a magnetic tape while the reproduction thereof is performed.

Figure 3:
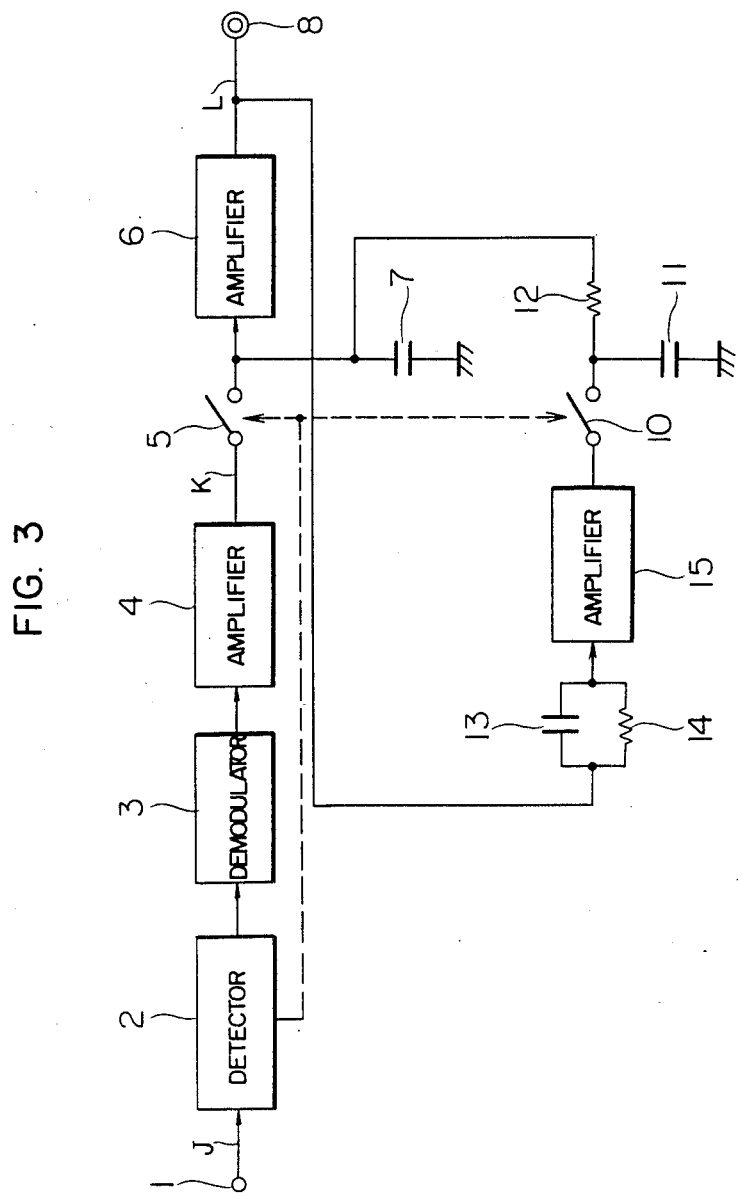
FIG. 3 is a block diagram of an apparatus according to another embodiment of this invention.

A second embodiment of this invention will now be described with reference to FIG. 3. In FIG. 3, the same component parts as those shown in FIG. 1 are designated by the same reference numerals, but the explanation thereof is omitted. Numeral 13 designates a capacitor one end of which is connected to an output terminal 8 of the amplifier 6, 15 an amplifier having an input terminal connected to the other end of the capacitor 13, and 14 a resistor connected in parallel with the capacitor 13. The amplifier 15 and the capacitor 13 in combination form a differentiating circuit.

A frequency modulated signal J reproduced through a reproducing circuit (not shown) from a recording medium such as a video tape is applied to an input terminal 1. The signal J passes the detector 2 for detecting the magnitude of the signal and is applied to the demodulator 3, where it is demodulated and converted into an audio signal or a musical signal. The demodulated signal is amplified through the amplifier 4 to generate an amplified signal K. The signal K passes the switch 5, when it is closed, and then it is applied to an input terminal to the amplifier 6, where the signal K is further amplified and delivered to the output terminal 8. Thus, an output signal L capable of driving a power amplifier and operating a loudspeaker is obtained at the output terminal 8. Though the holding capacitor 7 and the resistor 12 are connected to the input terminal to the amplifier 6, since the output impedance of the amplifier 4 is preset to have a low value and thus there is no influence on the frequency characteristics of the output signal of the amplifier 4 in the audio frequency band. Usually, under normal operating conditions, the signals recorded on a recording medium such as a video tape can be reproduced and heard by the use of this apparatus. However, in the helical-scan type magnetic recording and reproducing system employing a rotary head, the record tracks are not continuous, and thus a discontinuous modulated wave results in the reproduction of the recorded signals. Also, if defects exist in the magnetic tape, a dropout failure occurs in the reproduced modulated wave. In such a case, the demodulator 3 produces noise at the discontinuous portions or the dropout portions of the modulated wave. The operation to be performed by the apparatus of this invention shown in FIG. 3 when a dropout occurs in the reproduced modulated wave will be hereinafter described in detail.

Figure 4A:
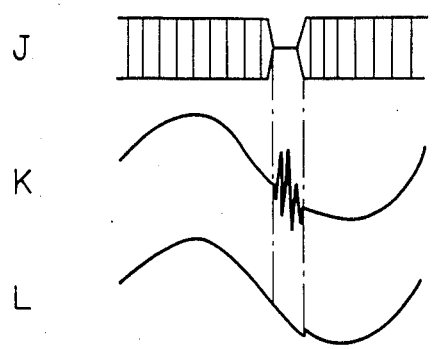
FIGS. 4A and 4B are waveform diagrams showing a plurality of waveforms generated at various portions of the apparatus shown in FIG. 3 which are useful for explaining the operation of the apparatus.
Figure 4B:
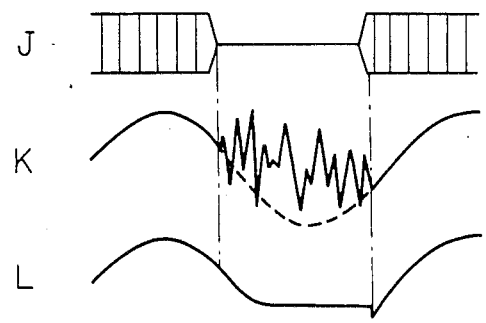

Before the time of occurrence of a dropout, a demodulated output is normally generated at the output terminal 8, as mentioned previously. The demodulated output is also applied to the amplifier 15 through the capacitor 13 and the resistor 14. The combination of the capacitor 13 and the amplifier 15 forms a differentiating circuit. Thus, a sum of the demodulated output supplied through the resistor 14 and a differentiated value of the demodulated output provided by the capacitor 13 is applied to the input to the amplifier 15 and an amplified sum signal is generated at its output. The output of the amplifier 15 is supplied through the switch 10, when it is closed, to the capacitor 11 and then to the input terminal to the amplifier 6 through the resistor 12. When a dropout occurs in the input reproduced signal J and thereby the level of the modulated wave of the signal J falls, the detector 2 starts its operation and switches off the switches 5 and 10, whereby the noise produced by the demodulator 3 is prevented from being transmitted to the output terminal 8. At the instant that the switches 5 and 10 are switched off, the capacitor 7 functions to hold the output voltage of the amplifier 4 immediately before the occurrence of the dropout noise and the capacitor 11 functions to hold the output voltage of the amplifier 15 immediately before the occurrence of the dropout noise. Then, since the output voltage of the amplifier 15 contains the differentiated value of the output signal from the amplifier 6, the output voltage of the amplifier 15 becomes higher than the input voltage of the amplifier 6 when the output voltage of the amplifier 6 increases, while, the former becomes lower than the latter when the output voltage of the amplifier 6 decreases. In other words, when the switches 5 and 10 are switched off in response to the occurrence of a dropout, the difference between the respective voltages across the capacitors 7 and 11 indicates the direction of a change of the demodulated output voltage immediately before the occurrence of the dropout. This voltage difference gradually diminishes to zero by virtue of the presence of the bridging resistor 12. Thus, the voltage across the capacitor 7 is caused to vary, in the same direction as the demodulated output voltage had been varying, from the value thereof at the instant when the switches 5 and 10 were switched off. The performance waveforms of the apparatus in FIG. 3 is shown in FIG. 4A. In FIG. 4A, symbols J, K and L indicate the signals J, K and L at various portions of the apparatus shown in FIG. 3. FIG. 4B shows the performance waveforms of the apparatus in FIG. 3 but when the duration of a dropout is long. As will be seen from FIGS. 4A and 4B, when the duration of the dropout is short, it is possible to reproduce a signal having a waveform similar to the original signal waveform and to obtain a greater noise reducing effect than that of the prior art apparatus. On the other hand, if the duration of the dropout is long, it becomes difficult to discern the corresponding original signal waveform, and hence, as the respective voltages across the capacitors 7 and 11 converge toward a final constant value, by maintaining the output voltage L at a constant value corresponding to the above-mentioned final constant value while the dropout is present, it is possible to reduce a detrimental effect of the dropout noise.

While the operation of the apparatus to be performed when a dropout occurs in the input reproduced signal has been described hereinbefore, it is possible to similarly reduce noise appearing in a demodulated output signal due to the discontinuity of the modulated waveform reproduced by the successive reproduction of the discrete record tracks on a magnetic tape. In this case, it is only necessary that, when the switching between the tracks to be reproduced is effected, the switches 5 and 10 are switched off in response to a track switching signal and remain opened over the time period, e.g., about ten microseconds, when the modulated wave becomes discontinuous.

While, in the embodiment of this invention shown in FIG. 3, each of the capacitor 13 and the resistor 14 has its one end connected to the output terminal of the amplifier 6, a similar function may be achieved by connecting one end of each of the capacitor 13 and the resistor 14 to the output terminal of the amplifier 4. In this case, however, the amplification degree decreases by the magnitude of the amplification degree of the amplifier 6, and therefore it becomes necessary to increase the amplification degree of the amplifier 15.

From the foregoing description it will be seen that the present invention can provide a great noise reducing effect because of the fact that, when noise occurs in a demodulated output signal from a demodulator, hold circuits are put into operation and a noise containing portion of the demodulated output signal is replaced by a substitute signal having a waveform close to the original signal waveform containing no noise. Further, since the apparatus of this invention operates to produce a constant output voltage when the duration of a dropout present in a modulated wave to be demodulated is long, it is possible to prevent noise produced by the demodulator from appearing in the waveform of a demodulated output signal.

I claim:

1. A noise reducing apparatus for reducing noise in audio signals comprising:
   a detector for detecting a magnitude of a frequency-modulated wave signal supplied as an input signal to said noise reducing apparatus and producing a detection output signal upon detection of an abnormal reduction in the magnitude of the frequency-modulated wave signal;
   a demodulator for demodulating the frequency-modulated wave signal supplied from said detector and producing a demodulation output signal;
   a first hold circuit comprising a first switch actuated by the detection output signal from said detector and a first capacitor for holding a voltage of the demodulation output signal from said demodulator;
   a differentiator for differentiating an output signal from an amplifier, an input of which is connected to an output end of said first capacitor, and producing a differentiation output signal;
   a second hold circuit comprising a second switch actuated by the detection output signal from said detector and a second capacitor for holding a voltage of the differentiation output signal from said differentiator; and
   a resistor for connecting the output end of said first capacitor with an output end of said second capacitor,
   said first switch and said second seitch being opened during a time period when said detector produces the detection output signal upon detection of said abnormal reduction in the magnitude of the frequency-modulated wave signal.

2. A noise reducing apparatus for reducing noise in audio signals comprising:
   means for generating a control signal when an abnormal reduction occurs in a magnitude of a frequency-modulated wave signal supplied as an input to said noise reducing apparatus;
   a demodulator for demodulating the frequency-modulated wave signal producing demodulation output signal;
   a first hold circuit comprising a first switch actuated by said control signal and a first capacitor for holding a voltage of the demodulation output signal from said demodulator;
   a differentiator for differentiating an output signal from an amplifier, an input of which is connected to an output end of said first capacitor, and producing a differentiation output signal;
   a second hold circuit comprising a second switch actuated by said control signal and a second capacitor for holding a voltage of the differentiation output signal from said differentiator; and
   a resistor for connecting the output end of said first capacitor with an output end of said second capacitor,
   said first switch and said second switch being opened by said control signal during a time period when said abnormal reduction occurs in the magnitude of the frequency-modulated wave signal.

* * * * *